United States Patent
Lee

(10) Patent No.: US 10,019,037 B2
(45) Date of Patent: Jul. 10, 2018

(54) NOTEBOOK COMPUTER CARRYING DEVICE

(71) Applicant: GETAC TECHNOLOGY CORPORATION, Hsinchu County (TW)

(72) Inventor: Kun-Cheng Lee, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 15/183,543

(22) Filed: Jun. 15, 2016

(65) Prior Publication Data
US 2017/0364124 A1  Dec. 21, 2017

(51) Int. Cl.
G06F 1/16 (2006.01)

(52) U.S. Cl.
CPC .......... *G06F 1/1656* (2013.01); *G06F 1/1628* (2013.01); *Y10T 16/455* (2015.01); *Y10T 16/473* (2015.01)

(58) Field of Classification Search
CPC .... G06F 1/1656; G06F 1/1628; Y10T 16/473; Y10T 16/455; Y10T 16/4554
USPC ........................................ 361/679.55, 679.59
See application file for complete search history.

(56) References Cited

U.S. PATENT DOCUMENTS

| | | | | |
|---|---|---|---|---|
| 3,168,173 A * | 2/1965 | Koffler | ................... | A45C 13/26 16/405 |
| 3,289,798 A * | 12/1966 | Gehrie | ................... | A45C 13/26 16/405 |
| 4,364,150 A * | 12/1982 | Remington | ............ | A45C 13/26 16/409 |
| 6,049,945 A * | 4/2000 | Prevot | .................. | B65D 23/106 16/110.1 |
| 6,208,504 B1 * | 3/2001 | Cho | ....................... | G06F 1/1616 312/223.1 |
| 7,712,590 B1 * | 5/2010 | Lee | ......................... | A45C 13/26 16/110.1 |
| 2003/0150082 A1 * | 8/2003 | Chen | ...................... | A45C 13/26 16/114.1 |
| 2004/0182667 A1 * | 9/2004 | Lin | ........................ | A45C 13/26 190/115 |
| 2010/0053888 A1 * | 3/2010 | Nagamura | ............ | G06F 1/1616 361/679.59 |
| 2012/0110783 A1 * | 5/2012 | Kao | .................. | B29C 45/14065 16/110.1 |

* cited by examiner

*Primary Examiner* — James Wu

(57) ABSTRACT

A notebook computer carrying device includes a carrier, a handle, and two telescopic members disposed at two ends of the handle and each including a first component and a second component, with the first components formed by extending the ends of the handle outward, and the second components disposed on the carrier. The first and second components of each telescopic member are movably connected, and the first component slides in a displacement direction from a first position to a second position. The displacement direction is defined as the start direction of the first position. A horizontal plane is defined by connecting the two ends of the handle. A vertical plane is defined to extend outward in the direction in which the horizontal plane faces the center of the handle. The displacement direction extends from the horizontal plane to vertical plane and forms an inclination angle relative to the horizontal plane.

11 Claims, 6 Drawing Sheets

NOTEBOOK COMPUTER CARRYING DEVICE

BACKGROUND OF THE INVENTION

Field of the Invention

The present invention relates to computer peripherals and, more particularly, to a notebook computer carrying device.

Description of the Prior Art

A conventional notebook computer is placed in a bag or suitcase in order to be carried. To allow a notebook computer to be carried easily by a user, a frame which the notebook computer is mounted on is provided and equipped with a handle gripped by the user's hand.

The aforesaid conventional handle either lacks sufficient mechanical strength to bear the weight of a notebook computer or is structurally intricate in order to have sufficient mechanical strength. The latter feature renders a manufacturing process complicated and incurs costs. In particular, the conventional handles which are telescopic and retractable exhibit structural intricacy inevitably. Furthermore, to attain sufficient mechanical strength, the conventional handles are usually made of metal and thus are seldom resistant to salt mist corrosion.

To overcome the aforesaid drawbacks of the prior art, the inventor of the present invention carried out related research with reference to related theories and eventually came up with a reasonable, effective solution embodied in the present invention.

SUMMARY OF THE INVENTION

It is an objective of the present invention to provide a notebook computer carrying device which is simple enough in structure to enable its handle to be highly telescopic and retractable and thus easy to carry by hand.

Another objective of the present invention is to provide a notebook computer carrying device with the handle made of a soft or hard plastic to not only simplify a manufacturing process and cut costs but also exhibit resistance to salt mist corrosion.

In order to achieve the above and other objectives, the present invention provides a notebook computer carrying device which is mounted on a notebook computer and comprises a carrier, a handle, and two telescopic members. The carrier is disposed on the notebook computer. The handle has two ends. Two telescopic members are disposed at the two ends of the handle, respectively, and each include a first component and a second component. The first components are formed by extending the ends of the handle outward, respectively. The first component and the second component of each telescopic member are movably connected, and the first component slides in a displacement direction from a first position to a second position. The displacement direction is defined as the start direction of the first position. The second component is disposed on the carrier. A horizontal plane is defined by connecting the two ends of the handle. A vertical plane is defined to extend outward in the direction in which the horizontal plane faces the center of the handle. The displacement direction extends from the horizontal plane to the vertical plane and forms an inclination angle relative to the horizontal plane.

DETAILED DESCRIPTION OF THE EMBODIMENTS

To enable examiners to gain insight into the technical features of the present invention, the present invention is illustrated with accompanying drawings and described below. However, the accompanying drawings are illustrative rather than restrictive of the present invention.

Figure 1:
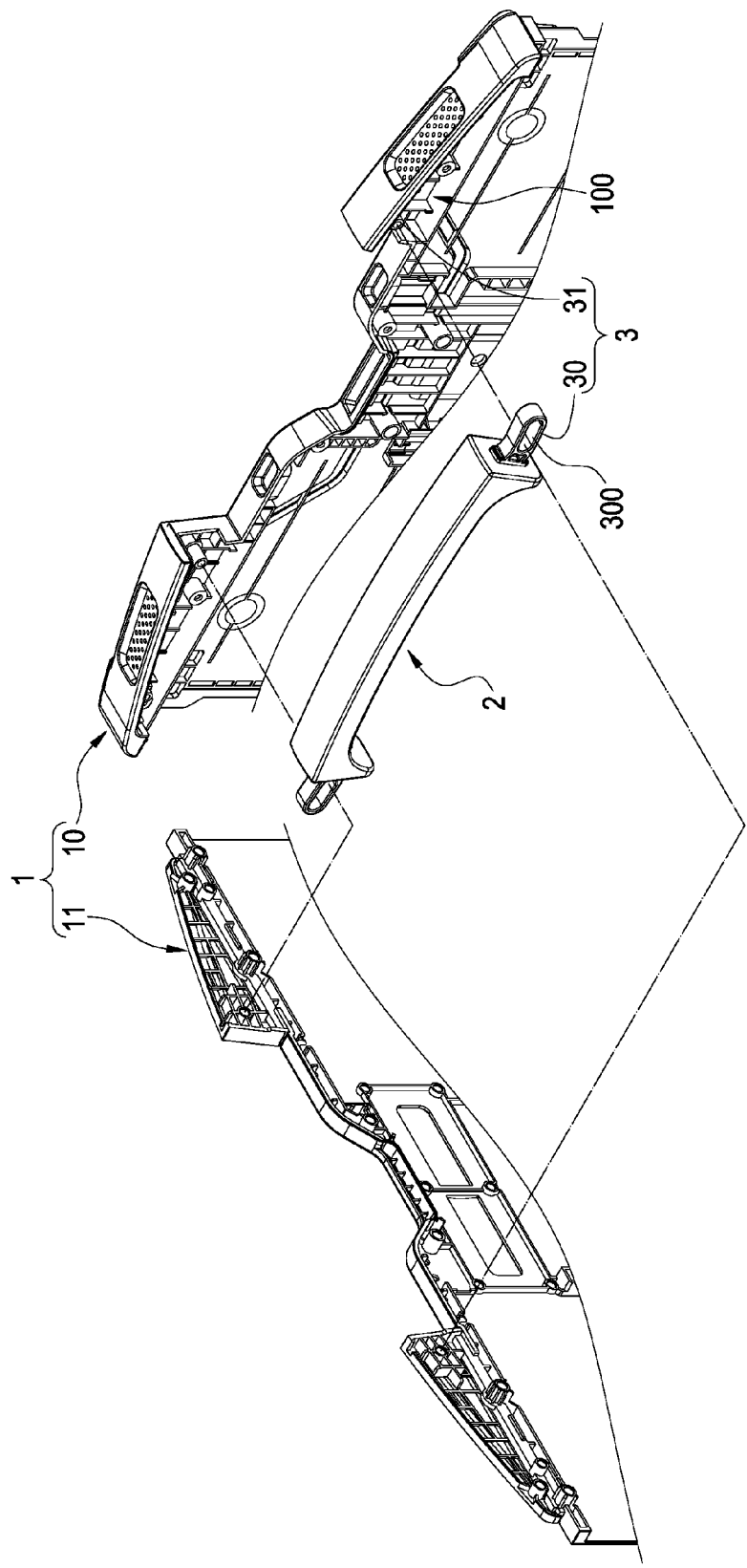
FIG. 1 is an exploded view of the present invention.
Figure 2:
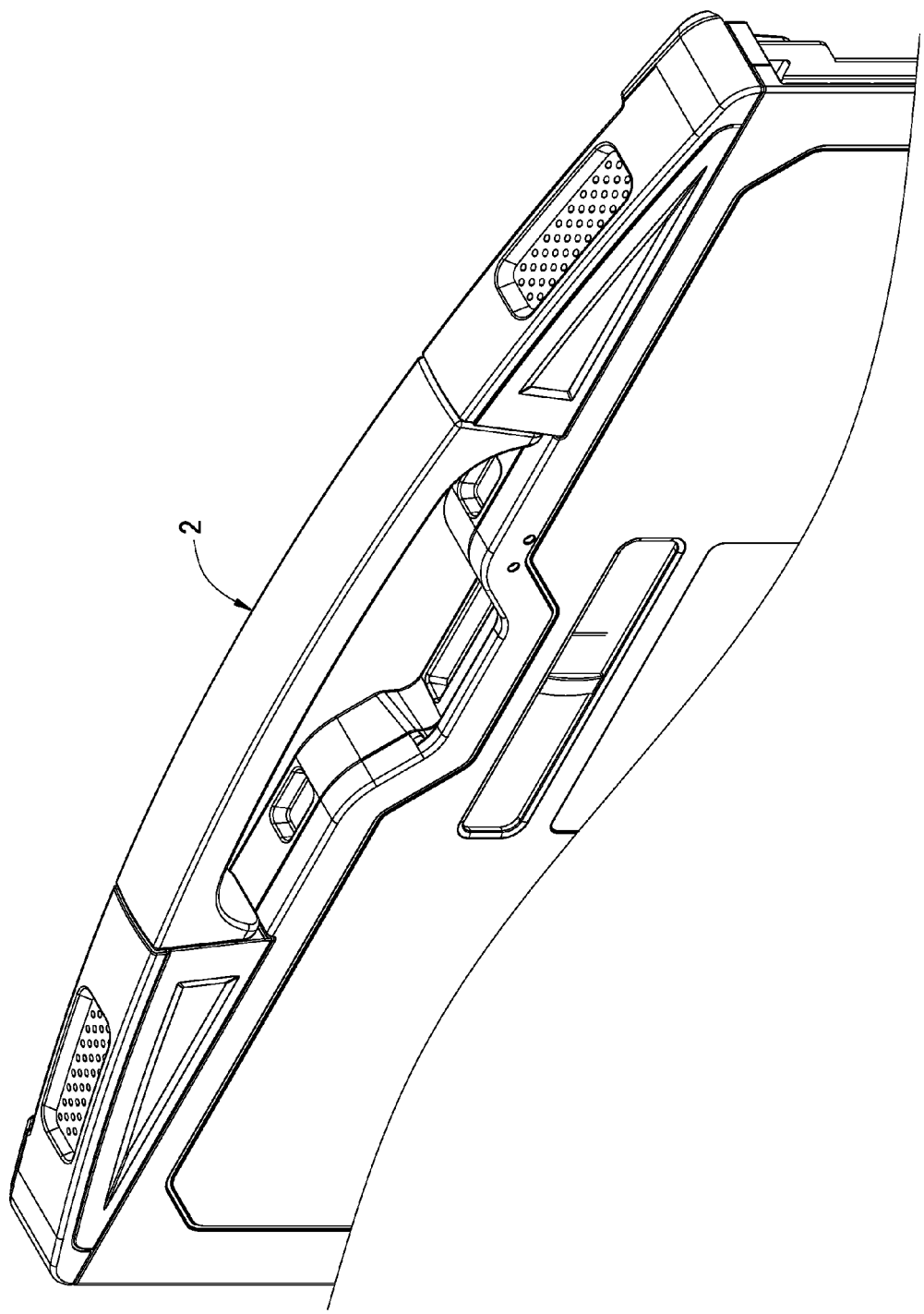
FIG. 2 is a perspective assembled view of the present invention.

Referring to FIG. 1 and FIG. 2, there are shown an exploded view and a perspective assembled view of the present invention, respectively. The present invention provides a notebook computer carrying device which is mounted on a notebook computer (not shown) so that the notebook computer can be easily gripped or carried. The notebook computer carrying device comprises a carrier 1, a handle 2, and two telescopic members 3.

The carrier 1 is disposed on the notebook computer. After the carrier 1 has been coupled to the notebook computer, the notebook computer can be carried by a user's hand together with the carrier 1. In an embodiment of the present invention, the carrier 1 comprises a first carrying portion 10 and a second carrying portion 11 which are coupled to each other. The carrier 1, the handle 2 and the telescopic members 3 are put together in order to operate. The handle 2 is disposed on the carrier 1 and gripped by the user's hand so as to lift the carrier 1 before the user grips and carries the notebook computer.

Figure 3:
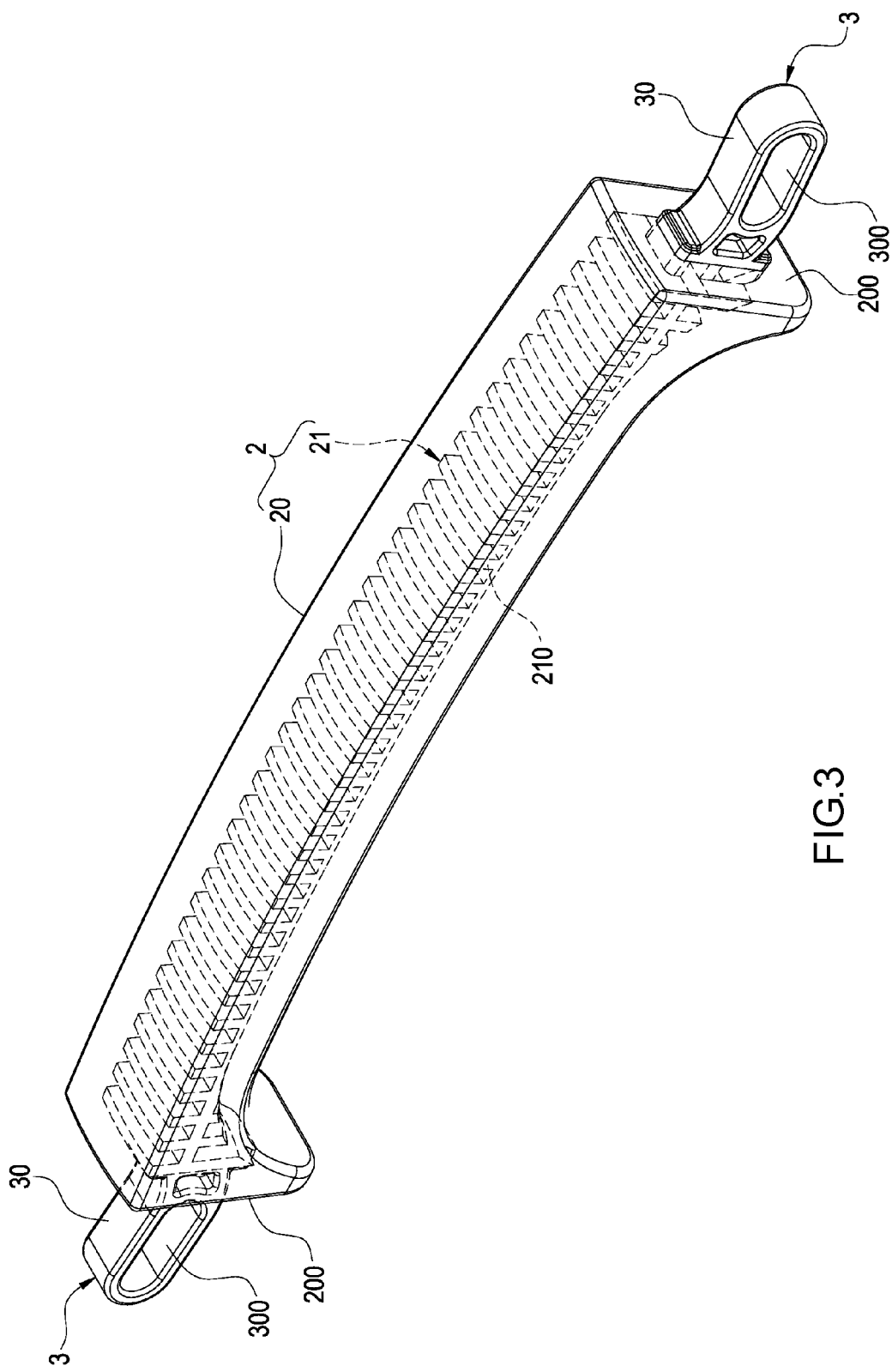
FIG. 3 is a perspective schematic view of a handle of the present invention.
Figure 4:
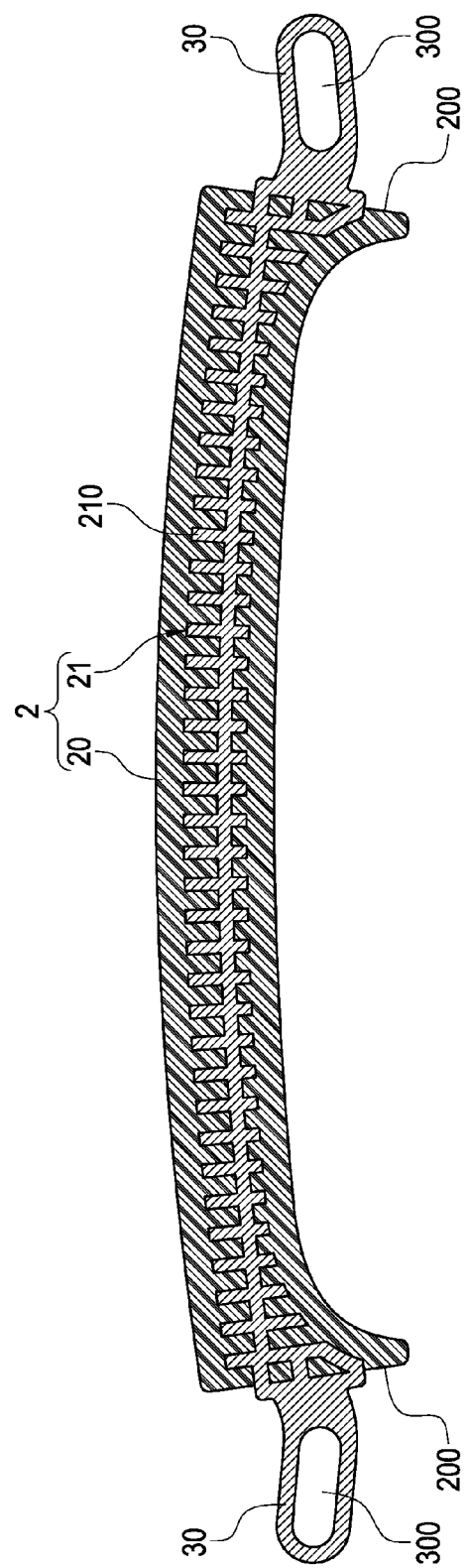
FIG. 4 is a cross-sectional view of the handle of the present invention.

Referring to FIG. 3 and FIG. 4, the handle 2 has two ends 200. A resilient deforming portion 20 and a flexible supporting portion 21 are disposed between the two ends 200 of the handle 2. The resilient deforming portion 20 encloses the flexible supporting portion 21. The resilient deforming portion 20 is made of a material softer than the flexible supporting portion 21; hence, as soon as the user's hand grips the handle 2 and then lifts the carrier 1 and/or the notebook computer, the resilient deforming portion 20 bends and deforms under an applied force F (shown in FIG. 6). As soon as the handle 2 is no longer subjected to the applied force F, the flexible supporting portion 21 causes the resilient deforming portion 20 to restore the initial state thereof (shown in FIG. 5).

The two telescopic members 3 are disposed at the two ends 200 of the handle 2, respectively, to connect the two ends 200 of the handle 2 to the carrier 1. In the embodiment of the present invention, the carrier 1 has two receiving recesses 100 corresponding in position to the two telescopic members 3, respectively.

Figure 5:
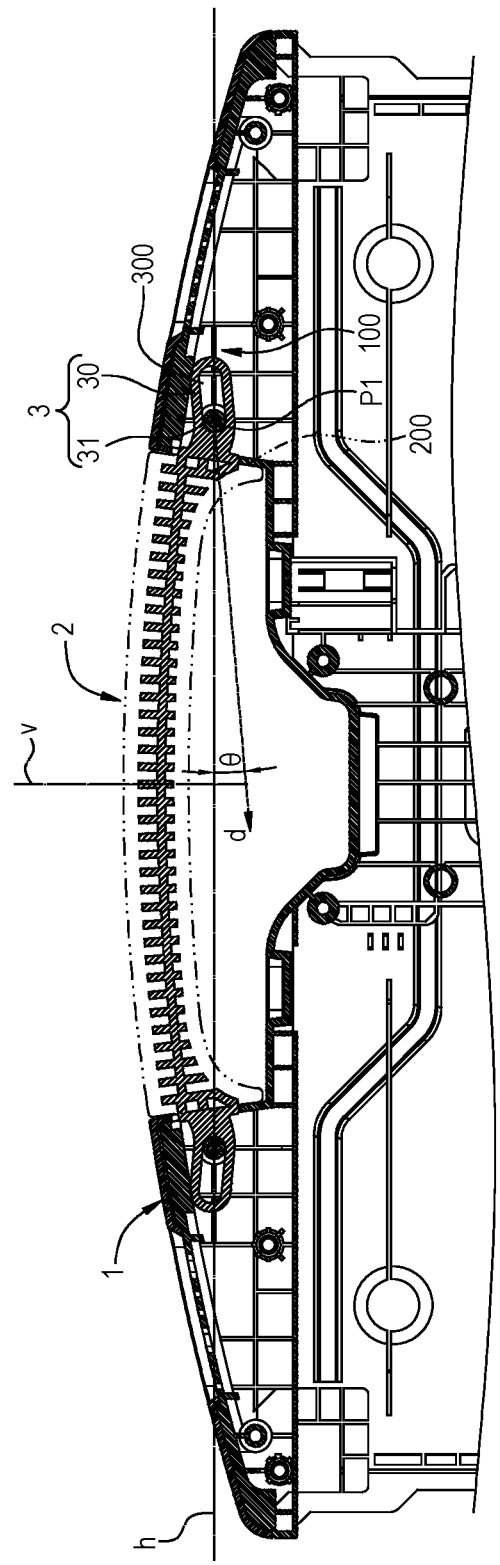
FIG. 5 is a cross-sectional view of the present invention in the absence of an applied force.
Figure 6:
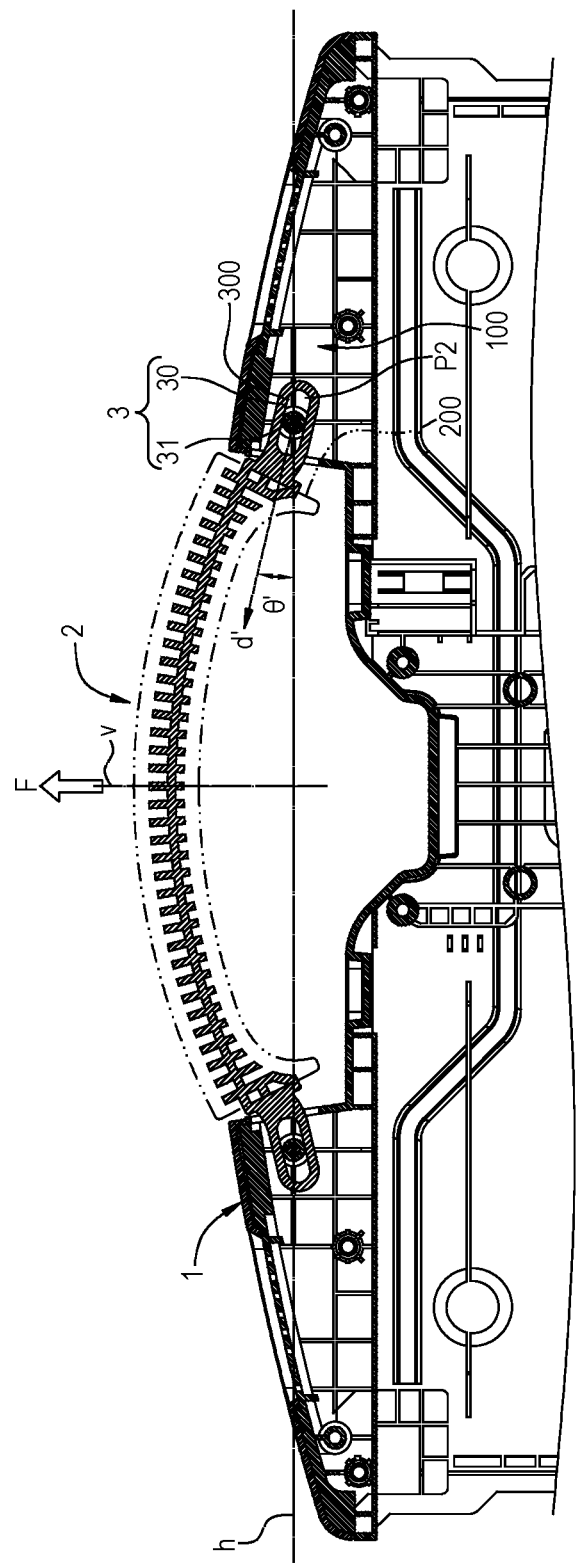
FIG. 6 is a cross-sectional view of the present invention in the course of being subjected to an applied force.

Referring to FIG. 5, each telescopic member 3 comprises a first component 30 and a second component 31. The first components 30 are formed by extending the ends 200 of the handle 2 outward and disposed movably in the receiving recesses 100, respectively. Alternatively, the first components 30 and the flexible supporting portion 21 of the handle 2 are integrally formed. The first component 30 and the second component 31 of each telescopic member 3 are movably connected, and the first component 30 slides in a displacement direction d from a first position P1 (shown in FIG. 5) to a second position P2 (shown in FIG. 6). The displacement direction d, which is defined as the start direction of the first position P1, changes to a displacement direction d' immediately after the first component 30 has slid from the first position P1 to the second position P2. The second components 31 are disposed on the carrier 1 and protruded from the receiving recesses 100, respectively. According to the present invention, a horizontal plane h is defined by connecting the two ends 200 of the handle 2, whereas a vertical plane v is defined (i.e., by the normal of the horizontal plane h) to extend outward in the direction in which the horizontal plane h faces the center of the handle 2. The vertical plane v extends in a direction (i.e., the direction of the normal of the horizontal plane h) in which the applied force F (shown in FIG. 6) is exerted upon the center of the handle 2.

The present invention is characterized in that: the displacement direction d extends from the horizontal plane h to the vertical plane v and forms an inclination angle θ relative to the horizontal plane h, and the displacement direction d' extends from the horizontal plane h to the vertical plane v on an opposite side of the horizontal plane and forms an inclination angle θ' relative to the horizontal plane h. Specifically speaking, each first component 30 has a sliding slot 300. The sliding slot 300, which extends from the horizontal plane h and away from the vertical plane v, forms the inclination angle θ relative to the horizontal plane h. Each second component 31 undergoes displacement within the sliding slot 300. Each first component 30 is a sliding ring with the sliding slot 300. Each second component 31 is a sliding block. Supporting ribs 210 are disposed on the flexible supporting portion 21 and spaced apart along the horizontal plane h.

Accordingly, given the aforesaid structures and features, the notebook computer carrying device of the present invention is effectuated.

Referring to FIG. 5, since the displacement direction d associated with the two telescopic members 3 when the handle 2 is subjected to a force forms the inclination angle θ relative to the horizontal plane h and the vertical plane v, the handle 2 restores its initial state as soon as the handle 2 gets free of the force, because: restoration of the material which the handle 2 is made of; the two telescopic members 3 are orientated by the inclination angle θ so that the two ends 200 of the handle 2 can have their positions independently restored until they are fixed in place. Hence, the handle 2 is highly telescopic and retractable and thus easy to carry by hand. Furthermore, the resilient deforming portion 20 of the handle 2 is made of a soft or hard plastic to not only simplify a manufacturing process and cut costs but also exhibit resistance to salt mist corrosion.

The present invention is disclosed above by preferred embodiments. However, the preferred embodiments should not be interpreted as restrictive of the claims of the present invention. Hence, all equivalent changes made to the aforesaid embodiments in terms of technical features and means with reference to the specification and drawings of the present invention should fall within the scope of the present invention.

What is claimed is:

1. A notebook computer carrying device, mounted on a notebook computer, comprising:
   a carrier disposed on the notebook computer and comprising two receiving recesses;
   a handle having two ends, wherein a horizontal plane is defined between the two ends of the handle, and a vertical plane is defined at a center of the handle; and
   two telescopic members disposed at the two ends of the handle, respectively, each telescopic member including a first component and a second component, wherein the first components respectively extend from the two ends of the handle, the second component of each said telescopic member is disposed in a corresponding one of the receiving recesses, the first component and the second component of each said telescopic member are movably connected, and the first component is slidable in the corresponding one of the receiving recesses in a first displacement direction from a first position to a second position, with the first displacement direction defined as a start direction of the first component at the first position when the handle is pulled in a direction away from the notebook computer;
   wherein the first displacement direction extends from the horizontal plane to a portion of the vertical plane below the horizontal plane and forms a first inclination angle relative to the horizontal plane; and
   wherein when the handle is pulled in the direction away from the notebook computer and each first component has slid to the second position, motion of each first component is changed to a second displacement direction, wherein the second displacement direction extends from the horizontal plane to a portion of the vertical plane above the horizontal plane and forms a second inclination angle relative to the horizontal plane, wherein each said first component comprises a sliding slot extending in the first displacement direction when the first component is in the first position.

2. The notebook computer carrying device of claim 1, wherein each of the second components comprises a protrusion formed in the corresponding one of the receiving, recesses, said protrusion received in the sliding slot of a corresponding one of the first components such that the sliding slot and protrusion limit the movement of the first component relative to the carrier.

3. The notebook computer carrying device of claim 1, wherein a flexible supporting portion and a resilient deforming portion are disposed between the two ends of the handle.

4. The notebook computer carrying device of claim 3, wherein the first components and the flexible supporting portion are integrally formed.

5. The notebook computer carrying device of claim 3, wherein the resilient deforming portion encloses the flexible supporting portion.

6. The notebook computer carrying device of claim 3, wherein the resilient deforming portion is made of a material softer than the flexible supporting portion.

7. The notebook computer carrying device of claim 3, wherein a plurality of supporting ribs are disposed on the flexible supporting portion and spaced apart along the horizontal plane.

8. The notebook computer carrying device of claim 1, wherein the vertical plane extends in a direction in which an applied force is exerted upon the center of the handle.

9. The notebook computer carrying device of claim 1, wherein the first positions of the first components are interior to the receiving recesses, respectively.

10. The notebook computer carrying device of claim 9, wherein the second positions of the first components are partially exterior to the receiving recesses, respectively.

11. The notebook computer carrying device of claim 1, wherein the horizontal plane passes through the second components of the two telescopic members.

\* \* \* \* \*